(12) United States Patent
Kim et al.

(10) Patent No.: US 10,763,243 B2
(45) Date of Patent: Sep. 1, 2020

(54) SUBSTRATE BONDING APPARATUS

(71) Applicant: Samsung Electronics Co., Ltd., Suwon-si, Gyeonggi-do (KR)

(72) Inventors: Jun-Hyung Kim, Yongin-si (KR); Sung-Hyup Kim, Hwaseong-si (KR); Kyeong-Bin Lim, Yongin-si (KR); Seok-Ho Kim, Hwaseong-si (KR); Tae-Yeong Kim, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 69 days.

(21) Appl. No.: 16/135,122

(22) Filed: Sep. 19, 2018

(65) Prior Publication Data
US 2019/0189593 A1    Jun. 20, 2019

(30) Foreign Application Priority Data
Dec. 18, 2017 (KR) .......................... 10-2017-0174597

(51) Int. Cl.
*H01L 25/065* (2006.01)
*H01L 21/67* (2006.01)
(Continued)

(52) U.S. Cl.
CPC .... *H01L 25/0657* (2013.01); *H01L 21/67092* (2013.01); *H01L 21/67259* (2013.01); *H01L 21/67288* (2013.01); *H01L 21/681* (2013.01); *H01L 21/687* (2013.01); *H01L 21/6875* (2013.01); *H01L 21/68735* (2013.01); *H01L 21/68742* (2013.01); *H01L 22/12* (2013.01); *H01L 25/50* (2013.01)

(58) Field of Classification Search
CPC .......... H01L 25/0657; H01L 21/67092; H01L 21/67259; H01L 21/67288; H01L 21/681; H01L 21/687; H01L 21/21; H01L 21/68735; H01L 21/68742; H01L 21/6875; H01L 22/12; H01L 25/20
See application file for complete search history.

(56) References Cited

U.S. PATENT DOCUMENTS

| | | | |
|---|---|---|---|
| 7,087,457 B2 | 8/2006 | Ogata et al. | |
| 2015/0357226 A1* | 12/2015 | Liu | H01L 25/50 438/457 |
| 2018/0122845 A1 | 5/2018 | Kim et al. | |

FOREIGN PATENT DOCUMENTS

| | | |
|---|---|---|
| JP | 2010-262271 A | 11/2010 |
| JP | 2013-258423 A | 12/2013 |

(Continued)

*Primary Examiner* — George R Koch
(74) *Attorney, Agent, or Firm* — Lee IP Law, P.C.

(57) ABSTRACT

A substrate bonding apparatus and a method of bonding substrates, the apparatus including an upper chuck securing a first substrate onto a lower surface thereof such that the first substrate is downwardly deformed into a concave surface profile; a lower chuck arranged under the upper chuck and securing a second substrate onto an upper surface thereof such that the second substrate is upwardly deformed into a convex surface profile; and a chuck controller controlling the upper chuck and the lower chuck to secure the first substrate and the second substrate, respectively, and generating a shape parameter for changing a shape of the second substrate to the convex surface profile from a flat surface profile.

18 Claims, 12 Drawing Sheets

(51) Int. Cl.
  *H01L 25/00* (2006.01)
  *H01L 21/66* (2006.01)
  *H01L 21/687* (2006.01)
  *H01L 21/68* (2006.01)

(56) References Cited

FOREIGN PATENT DOCUMENTS

| | | |
|---|---|---|
| KR | 10-0969532 B1 | 7/2010 |
| KR | 10-2013-0045536 A | 5/2013 |
| KR | 10-1496051 B1 | 2/2015 |

\* cited by examiner

SUBSTRATE BONDING APPARATUS

CROSS-REFERENCE TO RELATED APPLICATION

Korean Patent Application No. 10-2017-0174597 filed on Dec. 18, 2017 in the Korean Intellectual Property Office, and entitled: "Substrate Bonding Apparatus and Method of Bonding Substrates Using the Same," is incorporated by reference herein in its entirety.

BACKGROUND

1. Field

Embodiments relate to a substrate bonding apparatus and a method of bonding substrates using the same.

2. Description of the Related Art

A stack packaging process for vertically stacking a plurality of substrates may be used in semiconductor and flat panel display fields for high performance of semiconductor devices and display devices.

SUMMARY

The embodiments may be realized by providing a substrate bonding apparatus including an upper chuck securing a first substrate onto a lower surface thereof such that the first substrate is downwardly deformed into a concave surface profile; a lower chuck arranged under the upper chuck and securing a second substrate onto an upper surface thereof such that the second substrate is upwardly deformed into a convex surface profile; and a chuck controller controlling the upper chuck and the lower chuck to secure the first substrate and the second substrate, respectively, and generating a shape parameter for changing a shape of the second substrate to the convex surface profile from a flat surface profile.

The embodiments may be realized by providing a method of bonding substrates, the method including detecting a first center position, a first edge position, and a maximal deflection of a first substrate secured to an upper chuck and having a concave surface profile and a second center position and a second edge position of a second substrate secured to a lower chuck and having a flat surface profile; aligning the second substrate with the first substrate such that the second position of the second substrate coincides with the first center position of the first substrate; generating horizontal deformations of the first substrate and the second substrate from the detected the center positions and the edge positions of the first substrate and the second substrate, thereby obtaining a first chuck scale and a second chuck scale as the horizontal deformations of the first substrate and the second substrate, respectively; transforming a shape of the second substrate from the flat surface profile to a convex surface profile that is defined by a shape parameter including a chuck scale difference between the first chuck scale and the second chuck scale; and setting up a gap distance between the upper chuck and the lower chuck as a bonding gap that is a minimal gap distance for maintaining a linearity in converting the maximal deflection and the shape parameter to the chuck scale difference in bonding the first substrate and the second substrate.

The embodiments may be realized by providing a substrate bonding apparatus including an upper chuck on which a first substrate is securable such that the first substrate has a downwardly parabolic surface profile; a lower chuck arranged under the upper chuck, a second substrate being securable on the lower chuck and the lower chuck being configured to change a shape of the second substrate from a flat profile to an upwardly parabolic profile; and a chuck controller that controls the upper chuck and the lower chuck, the chuck being configured to generate a shape parameter for changing the shape of the second substrate to the upwardly parabolic profile from the flat profile, and move the upper chuck or the lower chuck to bring the first substrate into contact with the second substrate and bond the first substrate with the second substrate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
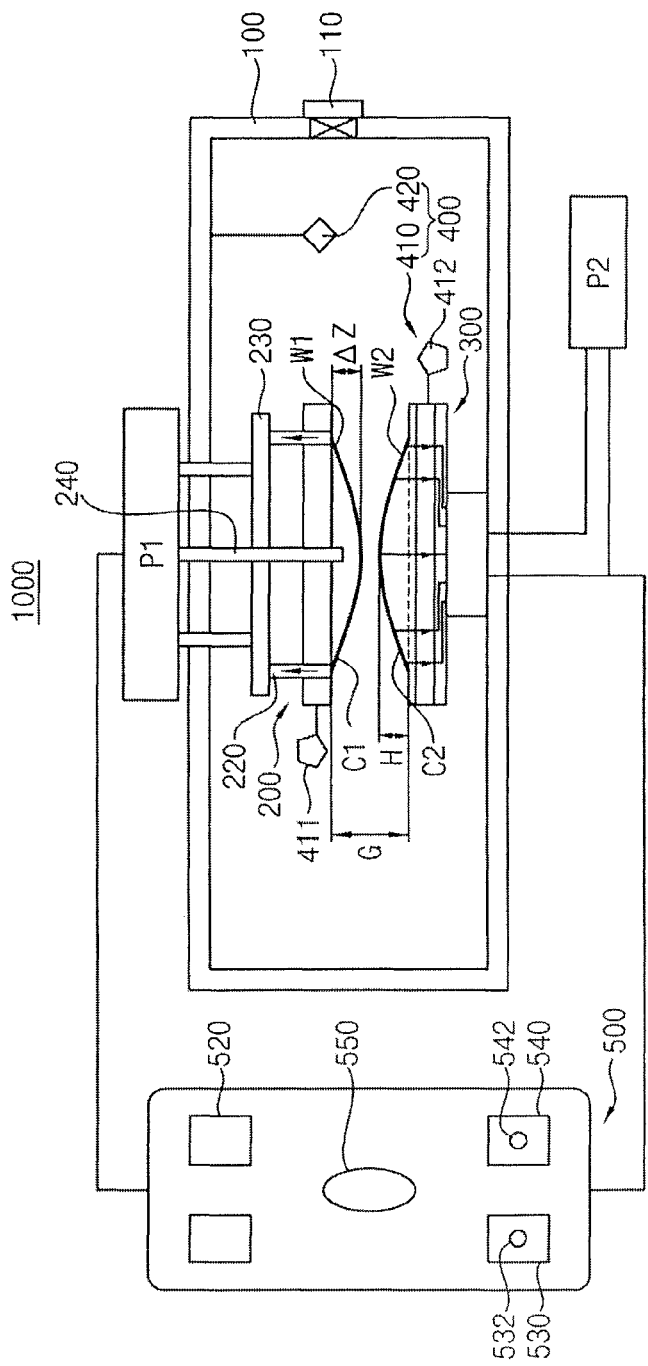
FIG. 1 illustrates a structural view of a substrate bonding apparatus in accordance with an example embodiment.
Figure 2:
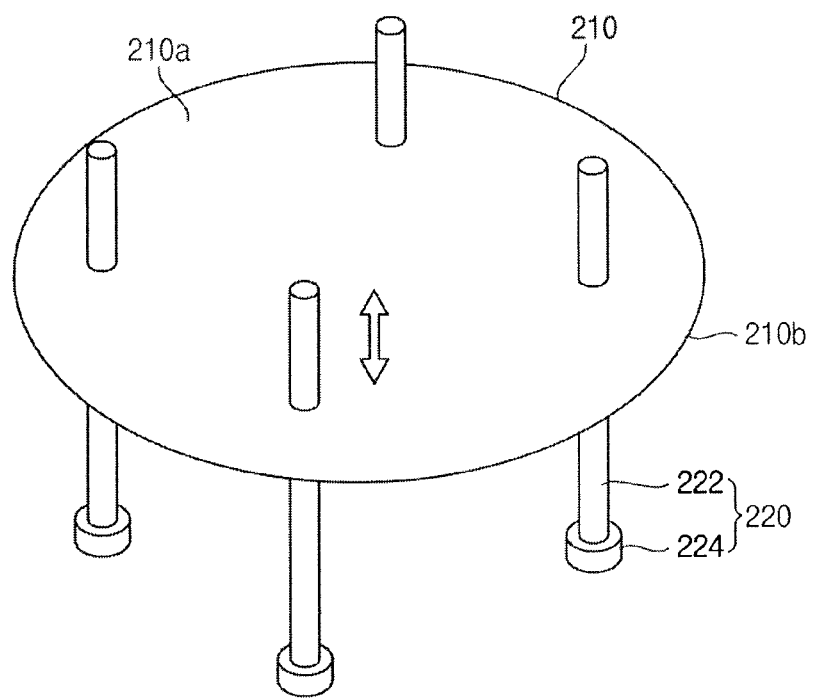
FIG. 2 illustrates a perspective view of an upper chuck of the substrate bonding apparatus shown in FIG. 1.
Figure 3A:
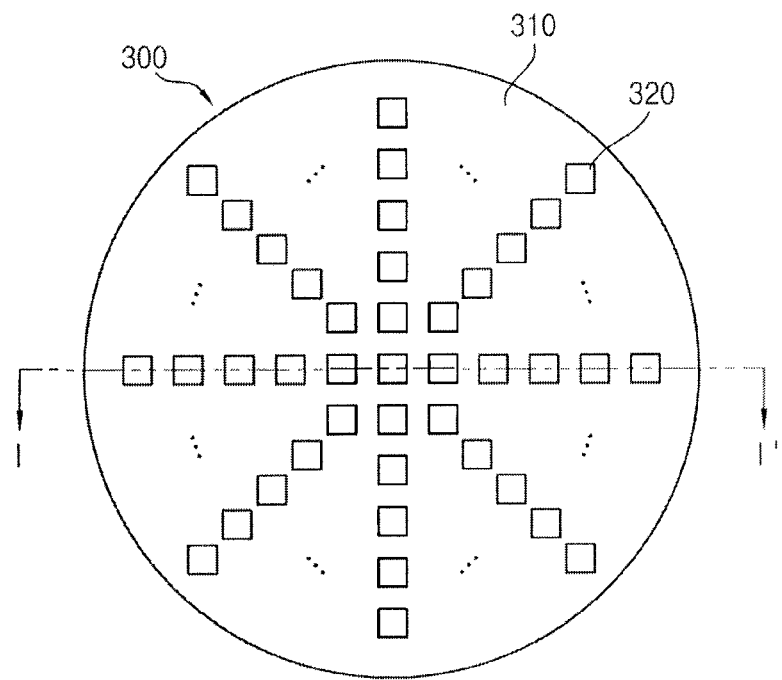
FIG. 3A illustrates a plan view of a lower chuck of the substrate bonding apparatus shown in FIG. 1 in accordance with an example embodiment.
Figure 3B:
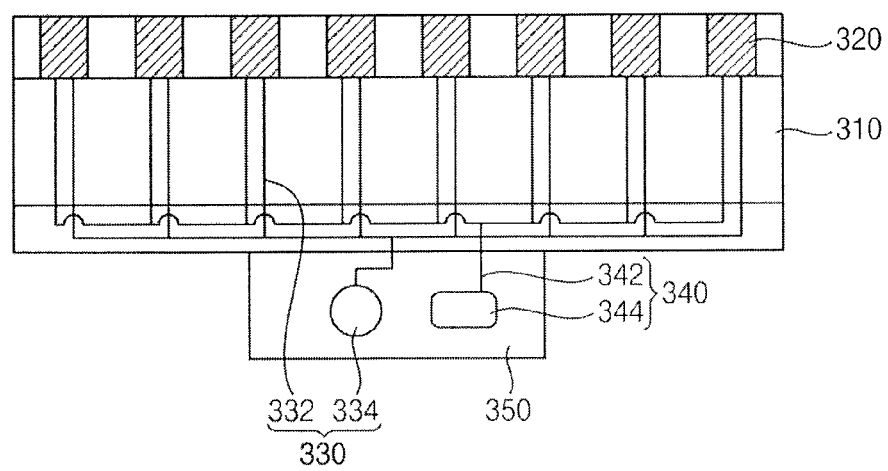
FIG. 3B illustrates a cross-sectional view of the lower chuck cut along a line I-I' shown in FIG. 3A.
Figure 3C:
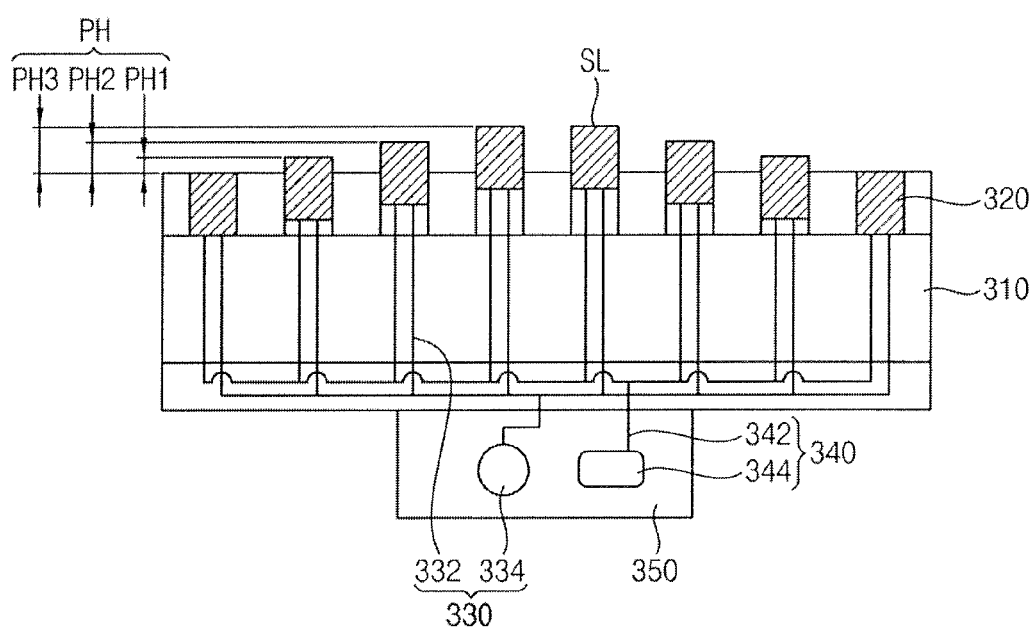
FIG. 3C illustrates a cross-sectional view of the lower chuck shown in FIG. 3B when a plurality of protrusions is protruded from a lower stage.

FIG. 1 illustrates a structural view of a substrate bonding apparatus in accordance with an example embodiment. FIG. 2 illustrates a perspective view of an upper chuck of the substrate bonding apparatus shown in FIG. 1. FIG. 3A illustrates a plan view of a lower chuck of the substrate bonding apparatus shown in FIG. 1 in accordance with an example embodiment, and FIG. 3B illustrates a cross-sectional view of the lower chuck cut along a line I-I' shown in FIG. 3A. FIG. 3C illustrates a cross-sectional view of the lower chuck shown in FIG. 3B when a plurality of protrusions is protruded from a lower stage.

Referring to FIGS. 1, 2 and 3A to 3C, a substrate bonding apparatus 1000 in accordance with an example embodiment may include an upper chuck 200 securing a first substrate W1 onto a lower surface thereof such that the first substrate W1 may be downwardly deformed into a concave surface profile C1, a lower chuck 300 arranged under the upper chuck 200 and securing a second substrate W2 onto an upper surface thereof such that the second substrate W2 may be upwardly deformed into a convex surface profile C2, and a chuck controller 400 controlling the upper and the lower chucks 200 and 300 to secure the first and the second substrates W1 and W2, respectively, and generating a shape parameter for changing a shape of the second substrate to the convex surface profile from a flat surface profile. The lower chuck 300 may move linearly and rotate in such a way that the first and the second substrates W1 and W2 may be aligned with each other. Further, the substrate bonding apparatus 1000 may further include a substrate detector 400 for detecting substrate states of the first and the second substrates W1 and W2.

In an implementation, the substrate bonding apparatus 1000 may include a chamber 100 having a predetermined chamber space and the upper and the lower chucks 200 and 300 may be provided in the chamber 100.

For example, the chamber 100 may include a rectangular or a cylindrical housing having a sufficient strength and rigidity and the chamber space may be isolated from surroundings in a substrate bonding process. A pair of the substrates may be loaded into the chamber 100 via a gate 110 and a pair of vertically combined substrates (stack substrate) may be unloaded from the chamber 100 via the gate 110 after completing the substrate bonding process. The gate 110 may include a door for selectively opening or closing the chamber space. When the substrate bonding process is conducted in the chamber 100, the door of the gate 110 may be closed and the chamber space may be isolated from surroundings. When the substrate bonding process is completed, the door of the gate 110 may be opened and the chamber space may be communicated with surroundings.

For example, the upper chuck 200 may be provided at an upper portion of the chamber 100 and the lower chuck 300 may be provided at a lower portion of the chamber 100. A first substrate W1 may be secured to the upper chuck 200 and a second substrate W2 may be secured to the lower chuck 300. The first and the second substrates may be bonded to each other in the substrate bonding process and may be formed into a single stack substrate in the chamber 100. The first and the second substrates W1 and W2 may include a wafer having a plurality of semiconductor chips and a glass panel having a plurality of thin film transistors.

The first substrate W1 may be secured to the upper chuck 200 and may be downwardly deformed with a concave surface profile C1.

For example, the upper chuck 200 may include an upper stage 210 shaped into a flat plate (e.g., having a flat plate shape) of which a diameter may be greater than that of the first substrate W1 and a plurality of suction lines 220 penetrating a peripheral portion of the upper stage and applying a first suction pressure to a peripheral portion of the first substrate W1.

The upper stage 210 may have a sufficient size for holding the first substrate W1 and may have a circular disk shape or a rectangular plate shape according to the shape of the first substrate W1. An upper surface 210a of the upper stage 210 may face a ceiling of the chamber 100 and a lower surface 210b of the upper stage 210 may face a bottom of the chamber 100. The first substrate W1 may be secured to the lower surface 210b of the upper stage 210 by the first suction pressure.

The suction lines 220 may be arranged along the peripheral portion of the upper stage 210 and may be spaced apart by the same gap distance along a circumferential line. For example, the suction applicator 220 may include a pressure cylinder 222 penetrating through the upper stage 210 at the peripheral portion of the upper stage 210 and a suction pad 224 coupled to an end of the pressure cylinder 222 under the upper stage 210 and sucking the first substrate W1 by the first suction pressure.

The pressure cylinder 222 may be secured to a base 230 and may move upwardly and downwardly. For example, a rack and pinion may be provided in the base 230 and the pressure cylinder 222 may linearly move upwardly and downwardly as the pinion rotates. For example, the pressure cylinder 222 may be connected to a first power source P1 and may transfer the first suction pressure to the suction pad 224 from the first power source P1.

Thus, the first substrate W1 may be secured to the suction pad 224 by the first suction pressure. A loading arm holding the first substrate W1 may be loaded into the chamber 100 via the gate 110 and may be positioned under the upper stage 210. Then the suction applicator 220 may move downwards to the loading arm and the first substrate W1 may be secured to the suction applicator 220. Thereafter, the suction applicator 220 may move upwards until the suction pad 224 is moved onto the upper stage 210, so that the first substrate W1 may be separated from the loading arm and be secured to the lower surface 210b of the upper stage 200. Then, the loading arm may be removed from the chamber 100.

A plurality of the suction lines 220 may be arranged along the peripheral portion of the upper stage 210, and the first suction pressure for securing the first substrate W1 may also be applied to the peripheral portion of the first substrate W1 through the peripheral portion of the upper stage 210. Accordingly, the peripheral portion of the first substrate W1 may be secured to the upper stage 210 and a central portion of the first substrate W1 may be downwardly deflected by a weight of the first substrate W1. For example, the first substrate W1 may be secured to the upper stage 210 with a concave surface profile C1.

The deflection of the first substrate W1 may decrease from the center to the peripheral portion in such a way that the deflection of the first substrate W1 may be maximized at the center and no deflection may occur at the peripheral portion of the first substrate W1. For example, the maximal deflection $\Delta Z$ may occur at the center, and no deflection may occur at a securing point of the peripheral portion at the first substrate W1, and thus the first substrate W1 may be downwardly deformed into a concave shape. For example, the first substrate W1 may have a concave surface profile such as a parabola having a vertex at the center of the first substrate W1.

In an implementation, four pressure cylinders 222 may be arranged at the peripheral portion along a circumferential line of the upper stage 210. In an implementation, the number of the pressure cylinder 222 may be varied according to the characteristics and requirements of the substrate bonding apparatus 1000.

A push rod 240 may be provided with the substrate bonding apparatus 1000 for pushing the first substrate W1 downwards. The push rod 240 may be connected to the first power source P1 and may penetrate through a central portion of the upper stage 210. When the substrate bonding process is initiated, the push rod 240 may be driven to move downwards and may press the first substrate W1 at a push pressure to bond with the second substrate W2 that may be secured to the lower chuck 300 and may be on standby under the upper stage 210.

The first power source P1 may be controlled by the chuck controller 500 and may generate the first suction pressure for securing the first substrate to the upper stage 210 and the driving power for moving the push rod 240 downwardly when the first and the second substrates W1 and W1 are to be bonded to each other.

The lower chuck 300 may be provided at a bottom of the chamber 100 and may be opposite to and face the upper chuck 200 in the chamber 100.

As illustrated in FIGS. 3A to 3C, the lower chuck 300 in accordance with a first example embodiment may include a lower stage 310 having a flat plate shape, a plurality of protrusions 320 arranged on an upper surface of the lower stage 310 and supporting the second substrate W2, a suction controller 330 applying a second suction pressure to the second substrate W2 via the protrusions 320 and a level controller 340 controlling top surface levels SL of the protrusions 320.

The lower stage 310 may have a flat plate shape having a sufficient size for holding the second substrate W2. The lower stage 310 may have a circular disk shape or a rectangular plate shape according to the shape of the second substrate W2. In an implementation, the lower stage 310 may have a flat disk shape of which the diameter may be greater than that of the second substrate W2.

The protrusion 320 may be shaped into a protruding bar that may be secured to and protruded from the lower stage 310. For example, a plurality of the protrusions 320 may be arranged into a plurality of concentric circles having a common center at the center of the lower stage 310. The protrusion 320 may be controlled to protrude from the lower stage 320 by a level controller 340 in such a way that the top surface levels SL of the protrusions 320 may be varied in conformity with the convex surface profile C2 of the second substrate W2. For example, the protrusions 320 of or forming a same concentric circle may have the same protruding height PH and the protrusions 320 of different concentric circles may have different protruding height PH, so that the protruding heights PH of the protrusions 320 may be different, by or based on the concentric circle. In an implementation, the top surface levels SL of the protrusions 320 may decrease in a radial direction of the lower stage 310, so the second substrate W2 (that may be secured to the top surface of the protrusions 320) may be deformed into the convex surface profile C2.

The protrusions 320 may be individually protruded from the lower stage 310 to the respective protruding height PH by a level controller 340 that may control a driving power to each protrusion 320 in such a way that the protrusions 320 constituting the same concentric circle may have the same protruding height PH. In an implementation, the protrusions 320 of an innermost concentric circle may be protruded to a third protruding height PH3 and the protrusions 320 of a next concentric circle (enclosing the innermost concentric circle) may be protruded to a second protruding height PH2. In the same way, the protrusions 320 of an outermost concentric circle may be protruded to a first protruding height PH1.

The suction controller 330 may include a plurality of suction lines 332 through which the second suction pressure may be applied to the second substrate W2 and a pressure controller 334 that is commonly connected to the plurality of the suction lines 332 and controlling the second suction pressure of each of the suction lines 332 such that the protrusions 320 of the same concentric circle may be under the same second suction pressure.

When the second suction pressure is applied to the lower chuck 300 from the second power source P2, the pressure controller 334 may uniformly supply the second suction pressure to the protrusions 320.

A minute suction pad may be provided at an end portion of each protrusion 320 and the suction line 332 may be connected to the suction pad, so the second substrate W2 may be secured to the minute suction pad by the second suction pressure that may be applied through the suction line 332. Accordingly, the second substrate W2 may be secured to the protrusions 320 by the second suction pressure. The second suction pressure may be uniformly applied to the second substrate W2 along the concentric circles.

The level controller 340 may include a plurality of driving lines 342 through which a driving power may be transferred to the protrusions 320 such that the protrusion 320 may be protruded to a protruding height PH from the lower stage 310 and a power controller 344 commonly connected to the plurality of the driving lines 342 and controlling the driving power of each of the driving lines 342 such that the protrusions 320 on the same concentric circle may have the same protruding height PH and the protruding heights PH of the protrusions 320 may decrease in the radial direction of the lower stage 310, thereby decreasing the top surface levels SL in the radial direction of the lower stage 310.

For example, a plurality of the driving lines 342 may be provided in the lower stage 310 and may be individually connected to the protrusions 320. For example, the driving line 342 and the protrusion 320 may be connected to each other by one to one. The plurality of the driving lines 342 may be commonly connected to the power controller 344 that may be connected to an external power source for driving the protrusion 320. The driving power may be transferred to the power controller 344 and the power controller 344 may control the driving power to be individually applied to each of the driving lines 342 in such a way that the protrusions 320 of the same concentric circle may be protruded to the same protruding height PH and the protrusions 320 of different concentric circles may be differently protruded from the lower stage 310 and the protruding heights PH of the protrusions 320 may decrease in the radial direction of the lower stage 310.

In an implementation, the driving power may include a pneumatic power and the driving line 342 may include an air line for transferring the pneumatic pressure to the protrusions 320. In an implementation, the power controller 344 may include a pressure divider for dividing the pneumatic pressure into a partition pressure corresponding to the respective protruding height PH of each concentric circle. In an implementation, the driving lines 342 and the power controller 344 may be varied according to the driving power and the configurations and requirements of the substrate bonding apparatus 1000.

The suction line 332 and the driving line 342 may penetrate through the lower stage 310 and may be connected to the pressure controller 334 and driving controller 344, respectively. The pressure controller 334 and the driving controller 344 may be installed in a support base 350 on which the lower stage 310 may be mounted and may be connected to the second power source P2. In an implementation, the second power source P2 may generate the suction pressure for sucking or holding the second substrate W2 to the protrusions 320 and the driving power for protruding the protrusions 320 from the lower stage 310. For example, the second power source may include a pneumatic power generator.

For example, the second substrate W2 may be secured to the protrusions 320 of the lower chuck 300 in such a way that the protruding height PH of the protrusions 320 may be different depending on the concentric circle and the top surface levels SL of the protrusions 320 may decrease in the radial direction of the lower stage 310. Accordingly, the second substrate W2 may be deformed according to the variation of top surface levels SL of the protrusions 320 and the surface profile of the second substrate W2 may be changed into an upward curve. For example, the second substrate W2 may be upwardly deformed into the convex surface profile C2 by the level controller 340. Thus, the concaved first substrate W1 and the convex second substrate W2 may be bonded into the stack substrate in the substrate bonding process with minimized horizontal deviation of the first and the second substrates W1 and W2.

The support base 350 may support the lower stage 310 and may move linearly in a horizontal direction and in a vertical direction in the chamber 100. In an implementation, the support base 350 may rotate with respect to the vertical direction in the chamber 100. For example, the second substrate W2 secured to the lower chuck 300 may be aligned with the first substrate W1 secured to the upper chuck 200 by the linear motion and the rotation of the support base 350.

The concave surface profile C2 of the second substrate W2 may be formed along the variation of the top surface levels SL of the protrusions 320 and the top surface levels SL of the protrusions 320 may be varied according to an individual control to the protruding height PH of the protrusions 320. In an implementation, the variation of the top surface levels SL of the protrusions 320 may also be obtained by an individual control to a height of the lower stage 310 to which the protrusions 320 may be secured in place of the individual control to the protruding height of the protrusions 320.

Figure 4A:
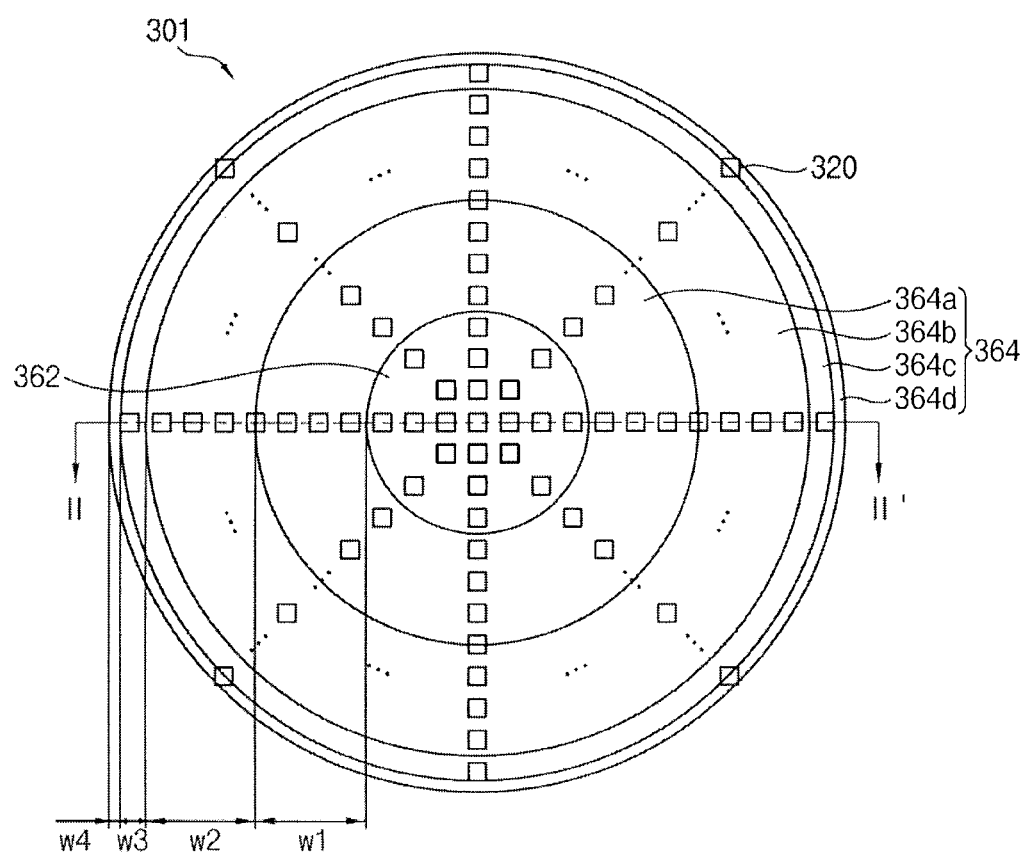
FIG. 4A illustrates a plan view of a lower chuck of the substrate bonding apparatus shown in FIG. 1 in accordance with a second example embodiment.
Figure 4B:
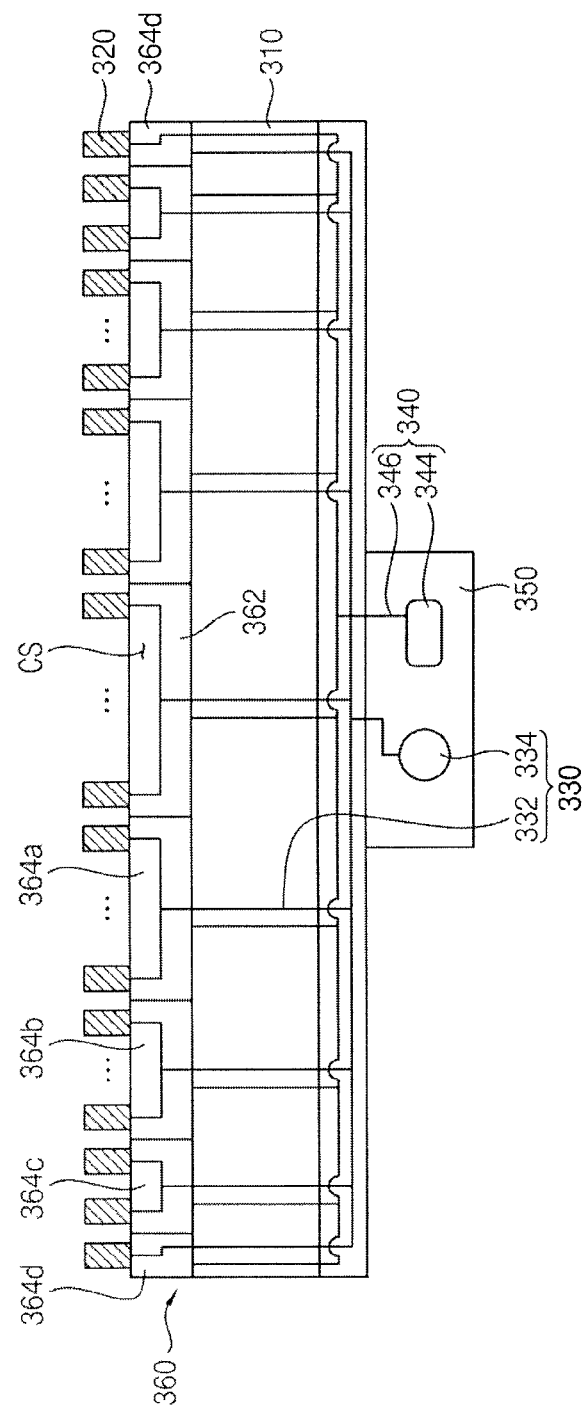
FIG. 4B illustrates a cross-sectional view of the lower chuck cut along a line II-II' shown in FIG. 4A.
Figure 4C:
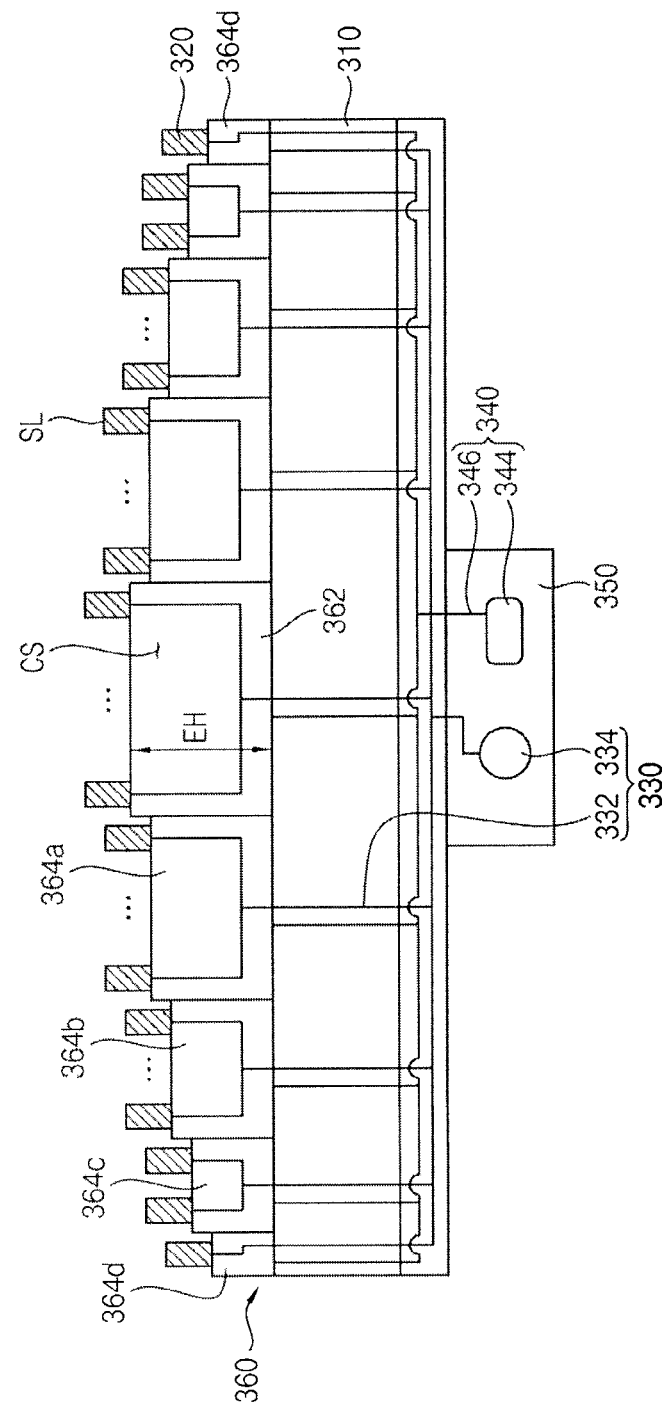
FIG. 4C illustrates a cross-sectional view of the lower chuck shown in FIG. 4B when an elastic base of the lower chuck is expanded.

FIG. 4A illustrates a plan view of a lower chuck of the substrate bonding apparatus shown in FIG. 1 in accordance with a second example embodiment, and FIG. 4B illustrates a cross-sectional view of the lower chuck cut along a line II-IF shown in FIG. 4A. FIG. 4C illustrates a cross-sectional view of the lower chuck shown in FIG. 4B when an elastic base of the lower chuck is expanded. In FIGS. 4A to 4C, the lower chuck 301 may have substantially the same structure as the lower chuck 300, except an elastic base 360 additionally arranged on the lower stage 310. Thus, the same reference numerals in FIGS. 4A to 4C denote the same elements in FIGS. 3A to 3C, and any further detailed descriptions on the same elements may be omitted hereinafter.

Referring to FIGS. 4A to 4C, the lower chuck 301 in accordance with another example embodiment may further include a disk-shaped elastic base 360 interposed between the lower stage 310 and the plurality of the protrusions 320. The elastic base 360 may be secured to the lower stage 310 and the plurality of the protrusions 320 may be secured to an upper surface of the elastic base 360. For example, the elastic base 360 may be expanded by an expansion power in such a way that an expanding height EH of the elastic base 360 may decrease in a radial direction of the elastic base 360 and the top surface levels SL of the protrusions 320 may decrease in conformity with the concave surface profile C2 of the second substrate W2.

For example, the elastic base 360 may include a control space CS therein. When an expansion power is applied to the control space CS by the level controller 340, the elastic base 360 may be expanded in a vertical direction perpendicular to the lower stage 310, not in a horizontal direction and thus the expanding height EH of the elastic base 360 may increase in the vertical direction. The plurality of the protrusions 320 may be arranged on the elastic base 360, and the top surface levels SL of the protrusions 320 may also be changed according to the height variation of the elastic base 360.

For example, the top surface levels SL of the protrusions 320 may be varied by the variation of the expanding heights EH of the elastic base 360, not by the variation of the protruding heights PH of the protrusions 320. Thus, the expanding height EH of the elastic base 360 may be changed in the radial direction.

For example, the elastic base 360 may include a center disk 362 and a plurality of separated rings 364 that may enclose the center disk 362 and be arranged concentrically in a radial direction. The center disk and the separated rings may be individually expanded by the expansion power and may have individual height H.

The elastic base 360 may be configured in such a structure that the elastic base 360 may be expanded or swelled in the vertical direction when the expansion power is applied. For example, when the expansion power is applied to the elastic base 360, the elastic base 360 may be expanded in the vertical direction and as a result, the protrusions 320 on the elastic base 360 may also be lifted upwards. Therefore, the top surface levels SL of the protrusions 320 may be varied according to the height variation of the elastic base 360.

For example, the lower stage 310 may be shaped into a flat disk and the center disk 362 may be secured to a central portion of the disk-shaped lower stage 310. The separated rings 364 may be secured to the lower stage 310 in such a way that the center disk 362 may be sequentially enclosed by the separated rings 364. For example, the separated rings 364 may be arranged concentrically in a radial direction of the center disk 362. In an implementation, the separated rings 364 may include first to fourth rings 364a to 364d that may be sequentially arranged outwardly from the center disk 362.

The center disk 362 and the separated rings 364 may be independently and individually controlled by the level controller 340, and thus the center disk 362 and the separated rings 364 may have individual heights. For example, the expansion power may be appropriately applied to each of the center disk 362 and the separated rings 364 by the level controller 340 and each of the center disk 362 and the separated rings 364 may be expanded to the respective expanding height EH corresponding to the applied expansion power.

For example, the center disk 362 and the separated rings 364 may be vertically expanded corresponding to the expansion power and the expanding heights EH of the elastic base 360 may be varied according to the applied expansion power. Thus, the top surface levels SL of the protrusions 320 may be varied according to the height variation of the center disk 362 and the separated rings 364. The second suction pressure may be applied to the second substrate W2 through the suction lines 332 and the second substrate W2 may be secured to top surfaces of the protrusions 320, and the second substrate W2 may be deformed according to the top surface levels SL of the protrusions 320. For example, the surface profile of the second substrate W2 may be deformed along the top surface levels SL of the protrusions 320.

The height variation of the elastic base 360 and the variation of the top surface levels SL of the protrusions 320 may be conducted by the level controller 340. For example, the level controller 340 may include a plurality of expanding lines 346 through which an expanding power may be transferred to each of the center disk 362 and the separated rings 364 in such a way that the center disk 362 and the separated rings 364 may be individually expanded to the expanding height EH from the lower stage 310, and a power controller 344 commonly connected to the plurality of the expanding lines 346 and controlling the expanding power of each of the expanding lines 346 in such a way that the expanding heights EH of the center disk 362 and the separated rings 364 may decrease in the radial direction, thereby decreasing the top surface levels SL of the plurality of the protrusions 320.

The level controller 340 may have substantially the same structures as the level controller 340 shown in FIGS. 3A to 3C, except for the expansion lines 362. The expansion line 362 may transfer the expansion power to the elastic base 360 and the driving line 342 may transfer the driving power to the protrusion 320. The expansion line 346 and the driving line 342 may have the same structures or may have different structures from each other as long as the expansion power or the driving power may be sufficiently transferred to the elastic base 360 and the protrusions 320. In an implementation, the expansion line 346 may include an air line for transferring the pneumatic power.

In an implementation, the elastic base 360 may be individually provided with the lower chuck 300 irrespective of the lower stage 310. In an implementation, the elastic base 360 may also be integrally provided with the lower stage in one body. For example, the lower stage 310 may include flexible materials having sufficient elasticity.

In an implementation, the width of the separated ring 364 may decrease in the radial direction such that the width of innermost separated ring 364a close or proximate to the center disk 362 may be larger than that of outermost separated ring 364d far from or distal to the center disk 362. For example, the first to fourth separated rings 364a to 364d may have first to fourth widths w1 to w4 that may decrease in the radial direction. For example, the elastic base 360 may be separated into pieces in such a way that the central portion of the elastic base 360 may be separately sparsely and the peripheral portion of the elastic base 360 may be densely separated. The center disk 362 corresponding to a core of the elastic base 360 and the first separated ring 364a may have relatively large widths and the second to fourth separated rings 364b to 364d corresponding to the peripheral portion of the elastic base 360 may have relatively small widths.

For example, the expansion of the elastic base 360 may be more accurately controlled at the peripheral portion than the central portion of the elastic base 360. As a result, the top surface levels SL of the protrusions 320 may be more accurately controlled at the peripheral portion than the central portion of the elastic base 360, and the surface profile of the second substrate W2 may be more accurately deformed at the peripheral portion than the central portion of the second substrate W2.

The horizontal deformation of the second substrate W2 caused by the convex surface profile C2 may cumulatively increase in the radial direction in the bonding process, and the deformation of the second substrate W2 need be controlled with more accuracy at the peripheral portion than the central portion.

As illustrated in FIG. 4C, when the expansion power may be transferred to each of the center disk 362 and the separated rings 364a to 364d corresponding to the respective expanding height EH and each of the center disk 362 and the separated rings 364a to 364d may be individually expanded by the expansion power.

In an implementation, the center disk 362 may be maximally expanded and the expansion size of the separated rings 364 may decrease in the radial direction, so that the expanding height EH of the elastic base 360 may decrease step by step from the central portion to the peripheral portion of the elastic base 360. Thus, the top surface levels of the protrusions 320 may also decrease from the central portion to the peripheral portion of the elastic base 360.

For example, the second substrate W2 may also be upwardly deformed according to the top surface levels SL of the protrusions 320 since the second substrate W2 may be secured to the top surface of the protrusions 320, so the second substrate W2 may be deformed to have the convex surface profile C2.

In an implementation, the elastic base 360 may have a configuration in which the center disk 362 is enclosed by four separated rings 364a to 364d. In an implementation, the number and the size of the separated rings 364 may be varied according to the control accuracy for the deformation of the second substrate W2.

The protrusions 320 of the lower chuck 300 in FIG. 3B may be individually controlled, and the control accuracy for the deformation of the second substrate W2 may be sufficiently high together with the demerits that the level controller 340 for controlling every protruding heights of the protrusion 320 may be very complicated. However, the protrusions 320 of the lower chuck 301 in FIG. 4B may be classified into some groups by the center disk 362 and the separated rings 364, so that a group of the protrusions 320 that may be arranged on each of the center disk 362 and the separated rings 364 may be simultaneously controlled just by expanding the center disk 362 and the separated rings 364. For example, the top surface levels SL of the protrusions 320 may be controlled just by controlling the expanding heights EH of some pieces of the elastic base 360. Accordingly, the control system for controlling the top surface level SL of the protrusion 320 may be remarkably simplified.

In an implementation, the expanding height EH of the elastic base 360 may be varied only in the radial direction. In an implementation, the expanding height EH of the elastic base 360 may be varied in an angular direction.

Figure 5A:
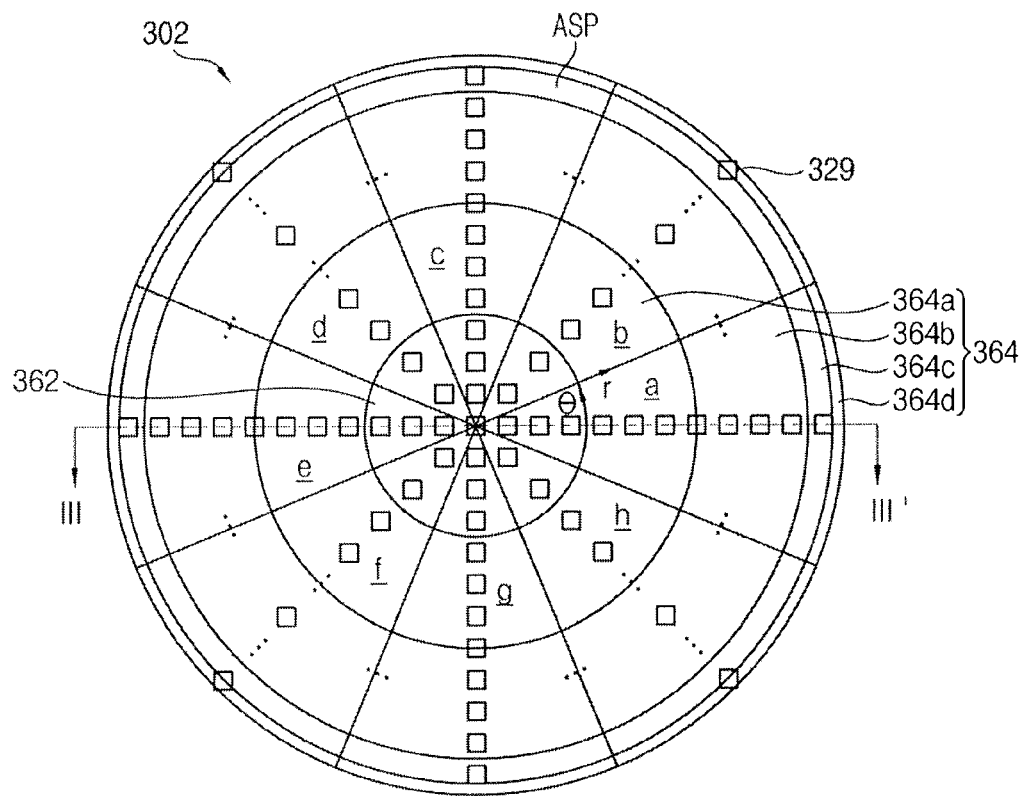
FIG. 5A illustrates a plan view of a modification of the lower chuck shown in FIG. 4A.
Figure 5B:
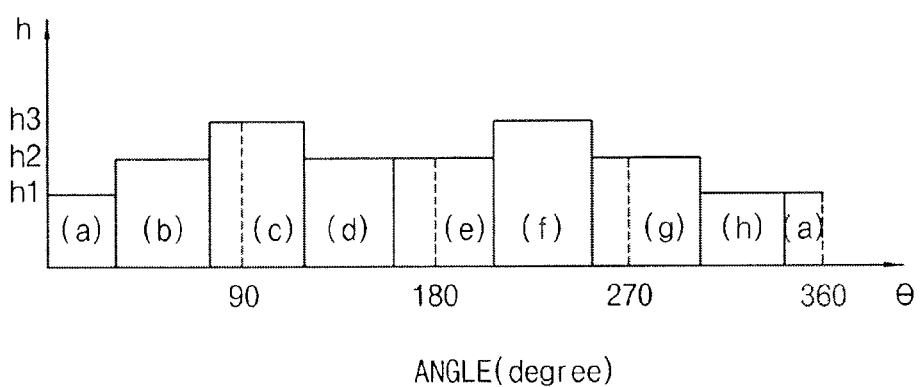
FIG. 5B illustrates a graph showing a height variation of the first separated ring of the modified lower chuck shown in FIG. 5A.
Figure 5C:
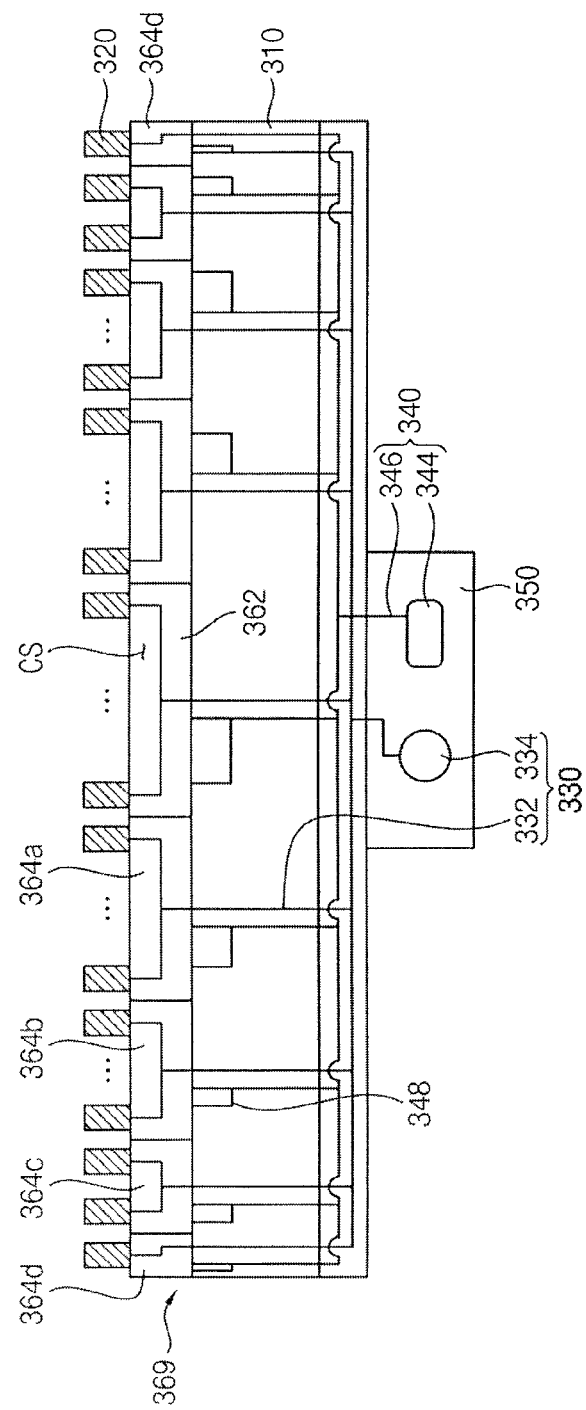
FIG. 5C illustrates a cross-sectional view of the modified lower chuck cut along a line III-III' shown in FIG. 5A.

FIG. 5A illustrates a plan view of a modification of the lower chuck shown in FIG. 4A. FIG. 5B illustrates a graph showing a height variation of the first separated ring of the modified lower chuck shown in FIG. 5A. FIG. 5C illustrates a cross-sectional view of the modified lower chuck cut along a line III-III' shown in FIG. 5A. In FIGS. 5A to 5C, the modified lower chuck 302 may have substantially the same structures as the lower chuck 301 shown in FIGS. 4A to 4C, except that the elastic base 360 may be separated into pieces in the angular direction as well as in the radial direction. Thus, the same reference numerals in FIGS. 5A to 5C denote the same elements in FIGS. 4A to 4C, and any further detailed descriptions on the same elements may be omitted hereinafter.

Referring to FIGS. 5A to 5C, the modified lower chuck 302 may include a modified elastic base 369 in which one of the center disk 362 and the separated rings 364 may be divided into a plurality of an angular separation pieces ASP in an angular direction at the same central angle θ.

In an implementation, the center disk 362 and the first to fourth separated rings 364a to 364d may be divided into the angular separation pieces ASP in a counter clockwise angular direction with respect to the center of the lower stage 310 at the same central angle θ. The angular separation pieces ASP may be individually expanded and may have individual height H. In such a case, the level controller 340 may further include a plurality of branch lines 348 diverged from each of the expanding line 346 for applying the expansion power to each of the angular separation pieces ASP.

For example, the first separated ring 364a may be divided into first to eighth angular separation pieces a to h in the angular direction. The first to eighths angular separation pieces a to h may be connected to a respective branch line 348 diverged from the expanding line 346 and individually applying the expansion power to the corresponding angular separation piece.

For example, the angular separation pieces ASP of the first separated ring 364a may have individual height, so the first separated ring 364a may have height deviation along the angular direction, as shown in FIG. 5B. In an implementation, the expanding height EH of the first, the second, and the third angular separation pieces a to c may increase step by step from a first height level h1 to a third height level h3 via a second height level h2. The expanding height EH of the fourth and the fifth angular separation pieces d and e may be set to be the second height level h2. In addition, the expanding height EH of the sixth, the seventh and the eighth angular separation pieces f to h may decrease step by step from the third height level h3 to the first height level h1 via the second height level h2.

The height level of each angular separation piece ASP may be determined by the characteristics of the second substrate W2 corresponding to the first separated ring 364a. For example, when the characteristics of the second substrate W2 may be uniform along an angular portion corresponding to the first separated ring 364a, the first to the eighth angular separation pieces a to h may have the same height level.

In an implementation, when the characteristics of the second substrate W2 are non-uniform along the angular portion corresponding to the first separated ring 364a, the strain caused by the suction pressure to the first separated ring 364a may also be non-uniform. For example, the physical properties and shape variations along the angular portion of the second substrate W2 may cause the non-uniform deformation when the suction pressure is applied to the angular portion of the second substrate W2 corresponding to the first separated ring 364a. In such a case, the height levels of the angular separation pieces a to h may be individually controlled in such a way that the deformation of the angular portion of the second substrate W2 may become uniform along the first separated ring 364a.

In an implementation, the first separated ring 364a may be divided into eight angular separation pieces a to h. In an implementation, the first separated ring 364a may be divided into more or less than 8 pieces according to the characteristics of the second substrate W2.

In an implementation, the second to the fourth separated rings 364b to 364d as well as the center disk 362 may be selectively divided into angular separation pieces ASP. For example, the height of the modified elastic base 369 may be more accurately controlled in such a way that the deformation of the second substrate W2 may be sufficiently uniform on a whole surface in spite of the non-uniform characteristics of the second substrate W2. The accurate control to the height of the modified elastic base 369 may increase the variation accuracy of the top surface levels SL of the protrusions 320 that may be secured to the modified elastic base 369, which may increase the shape accuracy of the convex surface profile C2 of the second substrate W2.

Hereinafter, the substrate bonding apparatus 1000 including the lower chuck 300 shown in FIGS. 3A to 3C will be described in detail. The embodiments may also be adopted to the substrate bonding apparatus 1000 including the lower chucks 301 and 302 shown in FIGS. 4A to 5C.

The protrusions 320 may have the same top surface levels SL at the time when the second substrate W2 is loaded into the chamber 100. When the second substrate W2 is positioned on the lower chuck 300, the second suction pressure may be uniformly applied to the second substrate W2 through the protrusions 320, so that the second substrate W2 may be secured to the lower chuck 300 with a flat surface profile.

Accordingly, while the first substrate W1 is secured to the upper chuck 200 with the concave surface profile C1 due to the first suction pressure that may be applied to the peripheral portion of the first substrate W1, the second substrate W2 may be secured to the lower chuck 300 with the flat surface profile due to the second suction pressure that may be uniformly applied to a whole surface of the second substrate W2. When completing the chucking of the first and the second substrates W1 and W2 to the upper and lower chucks 200 and 300, the centers of the first and the second substrates W1 and W2 may be aligned with each other by the substrate detector 400 for detecting substrate states.

For example, the substrate detector 400 may include a position detector 410 detecting positions of the first and the second substrates W1 and W2 and a deflection detector 420 detecting a maximal deflection of concave surface profile C1 of the first substrate W1.

In an implementation, the position detector 410 may include a pair of optical cameras that may be arranged at sides of the upper chuck 200 and the lower chuck 300, respectively, and the deflection detector 420 may include a gap sensor that may be secured to the chamber 100. In an implementation, the positions of the optical cameras and the gap sensor may be changed according to the configurations of the substrate bonding apparatus 1000.

A first camera 411 may be installed at a side of the upper chuck 200 and may detect the position of the center of the second substrate W2 and a second camera 412 may be installed at a side of the lower chuck 300 and may detect the position of the center of the first substrate W1.

The detected center positions of the first and the second substrates W1 and W2 may be transferred to a chuck controller 500. The chuck controller 500 may generate a position error between the center positions of the first and the second substrates W1 and W2 and may control the support base 350 to move and/or rotate in such a way that the center position of the second substrate W2 is corrected by the position error. Thus, the first and the second substrates W1 and W2 may be aligned with each other in the chamber 100.

The maximal deflection ΔZ of the concave surface profile C1 of the first substrate W1 may be detected by the deflection detector 420 such as the gap sensor. For example, the gap distance between the upper stage 210 and the first substrate W1 may be detected at a central portion and a peripheral portion of the first substrate W1 by the gap sensor, and then the gap sensor may generate the difference of the gap distances between the central portion and the peripheral portion of the first substrate W1 as the maximal deflection ΔZ of the concave surface profile C1.

In an implementation, the chuck controller 500 may include an aligner 510 for aligning the first and the second substrates with each other such that a center position of the first substrate coincides with a center position of the second substrate, a scaler 520 for generating a first chuck scale from a horizontal deformation of the first substrate and a second chuck scale from a horizontal deformation of the second substrate, a parameter generator 530 for generating the shape parameter of the convex surface profile C2 from the first and the second chuck scales and a bonding gapper 540 generating a minimal gap distance between the upper and the lower chucks 200 and 300 from the shape parameter and the maximal deflection ΔZ of the concave surface profile C1 of the first substrate W1.

When completing the chucking the first and the second substrates W1 and W2 to the upper and lower chucks 200 and 300, the centers of the first and the second substrates W1 and W2 may be aligned with each other by the substrate detector 400 for detecting substrate states.

The center positions of the first and the second substrates W1 and W2 and the maximal deflection ΔZ of the concave surface profile C1 of the first substrate W1 may be transferred to the aligner 510 and the position error may be calculated from the center positions of the first and the second substrates W1 and W2 in the aligner 510. Then, the aligner 510 may control the support base 350 to move and/or rotate in such a way that the center position of the second substrate W2 may be corrected by the position error. Thus, the first and the second substrates W1 and W2 may be secured to the upper and the lower chucks 200 and 300 and may have the same center in the chamber 100.

Posterior to the alignment between the first and the second substrates W1 and W2, the horizontal deformation of the first and the second substrates W1 and W2 may be detected by the position detector 410 and may be stored as the first chuck scale ST and the second chuck scale SB, respectively, in the scale scaler 520.

Figure 6A:
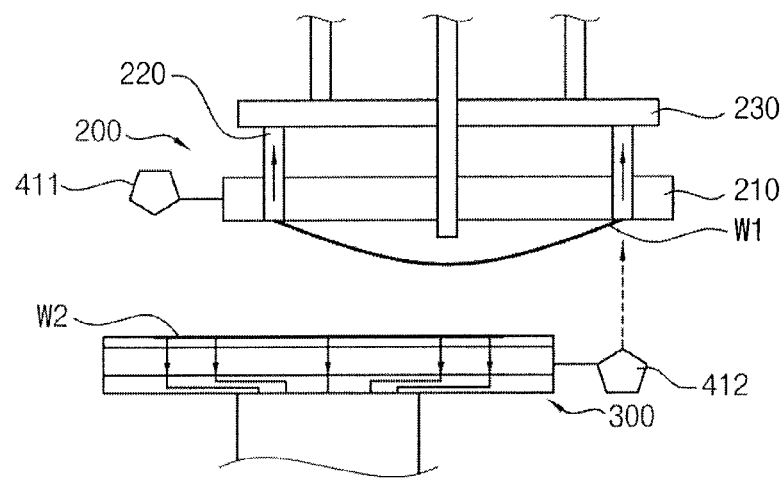
FIG. 6A illustrates a side view of a process for detecting the first chuck scale by using the first substrate.
Figure 6B:
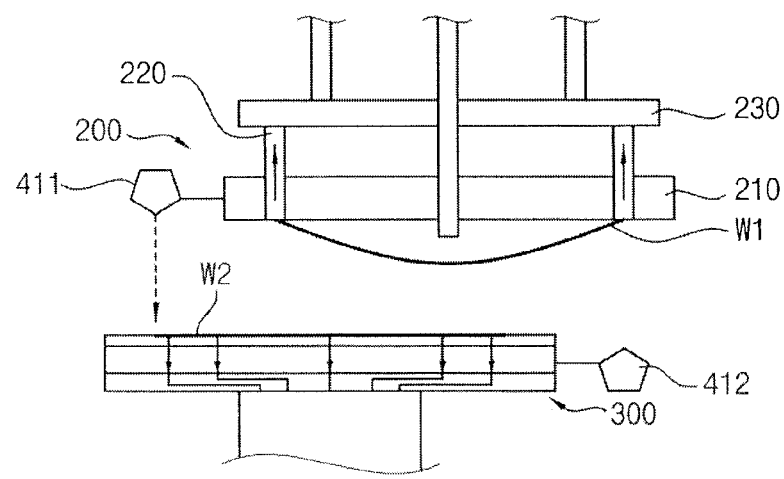
FIG. 6B illustrates a side view of a process for detecting the second chuck scale by using the second substrate.

FIG. 6A illustrates a view of a process for detecting the first chuck scale by using the first substrate W1 and FIG. 6B illustrates a view of a process for detecting the second chuck scale by using the second substrate W2.

Referring to FIG. 6A, when the first and the second substrates W1 and W2 are aligned with each other by the aligner 540, the scaler 520 may control the second camera 412 installed to the lower stage 310 to detect an edge position of the first substrate W1.

In such a case, the lower stage 310 may move together with the second camera 412 so as to detect the edge position of the first substrate W1. Otherwise, lower stage 310 may be stationary and only the second camera may move and rotate so as to detect the edge position of the first substrate W1.

For example, both of the center position and the edge position of the first substrate W1 may be detected by the position detector 410, and the gap distance between the center and the edge of the first substrate W1 may be calculated based on the center position and the edge position.

In an implementation, a bulk substrate such as a wafer may undergo a plurality of semiconductor manufacturing processes and a plurality of semiconductor chips may be formed on the bulk substrate, thereby forming the first substrate W1 having the semiconductor chips. Then, the first substrate W1 having the semiconductor chips may be loaded into the chamber 100 of the substrate bonding apparatus 1000 and may be secured to the upper chuck 200 with the concave surface profile C1. Thus, the gap distance between the center and the edge of the first substrate W1 secured to the upper chuck 200 (hereinafter, referred to as first detected distance) may be smaller than a gap distance between the center and the edge of the bulk substrate (hereinafter, referred to as first bulk distance). Thus, the difference between the first detected distance and the first bulk distance may indicate the horizontal deformation of the first substrate W1 by the semiconductor manufacturing process for forming the semiconductor chips on the first substrate W1 and the securing process for securing the first substrate W1 to the upper chuck 200. The horizontal deformation of the first substrate W1 may be stored as the first chuck scale ST in the scaler 520.

Referring to FIG. 6B, the scaler 520 may control the first camera 411 installed to the upper stage 210 to detect an edge position of the second substrate W2. In the same way as described above with reference to FIG. 6A, the upper stage 210 may move together with the first camera 411 so as to detect the edge position of the second substrate W2. In an implementation, the upper stage 210 may be stationary and only the first camera 411 may move and rotate so as to detect the edge position of the second substrate W2.

For example, both of the center position and the edge position of the second substrate W2 may be detected by the position detector 410, and the gap distance between the center and the edge of the second substrate W2 may be calculated based on the center position and the edge position.

In the same way, a bulk substrate such as a wafer may undergo a plurality of semiconductor manufacturing processes and a plurality of semiconductor chips may be formed on the bulk substrate, thereby forming the second substrate W2 having the semiconductor chips. Then, the second substrate W2 having the semiconductor chips may be loaded into the chamber 100 of the substrate bonding apparatus 1000 and may be secured to the lower chuck 300 with the flat or convex surface profile C2. Thus, the gap distance between the center and the edge of the second substrate W2 secured to the lower chuck 300 (hereinafter, referred to as second detected distance) may be smaller than a gap distance between the center and the edge of the bulk substrate (hereinafter, referred to as second bulk distance). Thus, the difference between the second detected distance and the second bulk distance may indicate the horizontal deformation of the second substrate W2 by the semiconductor manufacturing process for forming the semiconductor chips on the second substrate W2 and the securing process for securing the second substrate W2 to the lower chuck 300. The horizontal deformation of the second substrate W2 may be stored as the second chuck scale SB in the scaler 520.

The parameter generator 530 may generate the shape parameter of the convex surface profile C2 that may be deformed from the flat surface profile of the second substrate W2.

In some substrate bonding apparatuses, the first concave substrate may be bonded to the second flat substrate and the concave surface of the first substrate may be stretched out along the flat surface of the second substrate. As a result of the stretch of the concave substrate, the displacement of a point on the concave substrate may necessarily be different from the displacement of a point on the flat substrate with respect to the common center of the concave substrate and the flat substrate. Therefore, the stack substrate could have a horizontal deviation corresponding to the displacement difference between the concave substrate and the flat substrate.

The displacement may increase in the radial direction of the substrate, and the horizontal deviation between the concave substrate and the flat substrate may increase in the radial direction For example, although the concave substrate secured to the upper chuck 200 and the flat substrate secured to the lower chuck 300 may be correctly aligned with each other, the contact pad on the concave substrate may not accurately contact the contact pad on the flat substrate, so that a contact failure could occur in the stack substrate.

For preventing the above contact failures of the stack substrate, the second substrate W2 may be deformed into the convex surface profile C2 just by controlling the top surface levels SL of the protrusions 320. For example, the parameter generator 530 may generate the shape parameter for converting the flat surface profile to the convex surface profile C2 of the second substrate W2 in such a way that the horizontal deviation between the first and the second substrates W1 and W2 may be minimized in the boding process. In an implementation, the shape parameter may be obtained from the first and the second chuck scales ST and SB by the parameter generator 530.

In an implementation, the concave surface profile C1 of the first substrate W1 may be shaped into a downward parabolic curve having a first vertex corresponding to the maximal deflection $\Delta Z$, and the convex surface profile C2 of the second substrate W2 may be deformed to an upward parabolic curve having a second vertex corresponding to a predetermined target height.

For example, the parameter generator 530 may determine the target height H from the first and the second chuck scales ST and SB by the following Equation (1). Then, the second substrate W2 may be deformed into the upward parabolic curve having the second vertex corresponding to the target height H.

$$H=C1(ST-SB) \qquad (1)$$

(wherein, H denotes the target height for the convex surface profile C2 of the second substrate W2, ST denotes the first chuck scale, SB denotes the second chuck scale and C1 denotes a proportional constant).

For example, the proportional constant C1 may be determined experimentally in consideration of linear characteristics of the second substrate W2. When the second substrate W2 has sufficient linear characteristics, most of the chuck scale difference between the first and the second chuck scales ST and SB may be converted into the horizontal displacement of the first and the second substrates W1 and W2 in the bonding process. In contrast, when the first and the second substrates W1 and W2 have no linear characteristics, the chuck scale difference may be hardly converted into the horizontal displacement of the first and the second substrates W1 and W2 in the bonding process. For that reason, the proportional constant C1 may be experimentally determined in such a way that the chuck scale difference may be sufficiently converted into the horizontal displacement in the bonding process in view of the linearity of the second substrate W2. In an implementation, the proportional constant C1 may be in a range of about 0.5 to 3, e.g., may be set to be 1. Accordingly, the parameter generator 530 may determine the target height H of the downward parabolic curve by the equation (1).

Then, a driving signal generator 532 may be provided in the parameter generator 530. When the target height H is determined in the parameter generator 530, the driving signal generator 532 may generate a driving signal for protruding the protrusions 320 from the lower stage 310. Then, a central processor 550 of the chuck controller 500 may transfer the driving signal to the second power source P2 and the power controller of the level controller 340. Thus, the protrusions 320 may be protruded from the lower stage 310 by the concentric circles in response to the driving signal.

Therefore, the protrusions 320 on the central portion of the lower stage 310 (central protrusions) may be protruded to the protruding height PH corresponding to the target height H and the other protrusions 320 except the central protrusions may be protruded to the protruding heights PH that are smaller than the protruding height PH of the central protrusions and may decrease step by step toward the peripheral portion of the lower stage 310. For example, the top surface levels SL of the protrusions 320 may decrease in the radial direction of the disk-shaped lower stage 310.

The second suction pressure may be uniformly applied to the second substrate W2 via the protrusions 320 and the protruding heights PH of the protrusions may decrease in the radial direction of the lower stage 310, and the second substrate W2 may be deformed into the upward parabolic curve having a vertex corresponding to the target height H along a whole surface of the lower stage 310, so that the second substrate W2 may be deformed into the convex surface profile C2.

For example, the concave surface profile C1 of the first substrate W1 may be shaped into a downward parabolic curve having a vertex corresponding to the maximal deflection $\Delta Z$ and the convex surface profile C2 of the second substrate W2 may be shaped into an upward parabolic curve having a vertex corresponding to the target height H.

In an implementation, the first and the second chuck scales ST and SB may be obtained on a basis of the direct detection of the substrate states by the substrate detector 400 in the chamber 100. In an implementation, the first and the second chuck scales ST and SB may also be obtained by a mathematical estimation from the cumulative warpage characteristics of the first and the second substrates W1 and W2 prior to the loading into the chamber 100.

The maximal deflection $\Delta Z$ of the first substrate W1 may be principally determined by a first warpage that may be a vertical deformation in the semiconductor manufacturing process and a bending stress that may be applied to the first substrate S1 by the first suction pressure. In addition, the horizontal deformation of the first substrate W1 may be principally determined by a first scale S1 that may be a horizontal deformation in the semiconductor manufacturing process and a bending strain that may be applied to the first substrate S1 by the first suction pressure. Thus, the first chuck scale ST may be determined by the first warpage, the first scale and the first suction pressure for determining the bending stress and strain.

The relationships between the first chuck scale ST and the first warpage, the first scale and the first suction pressure may be estimated by the statistical analysis to the experimental data as the following Equation (2).

$$ST=f(S1,Wp1,P) \qquad (2)$$

(wherein, ST denotes the first chuck scale, S1 denotes the first scale, Wp1 denotes the first warpage and P denotes the first suction pressure).

The second suction pressure may be uniformly applied to the second substrate W2, and the vertical deformation and horizontal deformation caused by the second suction pressure may be negligible in the second substrate W2. For example, the second chuck scale SB of the second substrate W2 may be principally determined by a second warpage that may be a vertical deformation of the second substrate S2 in the semiconductor manufacturing process and a second scale S2 of the second substrate S2 that may be a horizontal deformation in the semiconductor manufacturing process. In the same statistical analysis as the first chuck scale ST, the relationships between the second chuck scale ST and the second warpage and the second scale may be estimated as the following Equation (3).

$$SB = f(S2, Wp2) = S2 + C0\,Wp2 \tag{3}$$

(wherein, SB denotes the second chuck scale, S2 denotes the second scale, Wp2 denotes the second warpage and C0 denotes a proportional constant).

For example, the second chuck scale SB may be hardly influenced by the second suction pressure, and the Equation (3) may be approximated into a linear equation by using an appropriate proportional constant.

For example, the first and the second chuck scales ST and SB may be obtained from the warpage and scale in the semiconductor manufacturing process. In such a case, the chuck controller 500 may further include an input for inputting the warpage and scale data of the semiconductor manufacturing process, a memory for storing the warpage and scale data, and a user interface communicating between the operator of the substrate bonding apparatus 1000 user and the chuck controller 500.

The bonding gapper 540 may determine a minimal gap distance between the upper and the lower chucks 200 and 300 from the shape parameter of the convex surface profile C2 and the maximal deflection ΔZ of the concave surface profile C1. In an implementation, the target height H of the upward parabolic curve may be used as the shape parameter of the convex surface profile C2.

The concave first substrate W1 and the convex second substrate W2 may be bonded into a single flat stack substrate in the bonding process, so the concave and convex surface profiles C1 and C2 may be transformed into a flat surface profile of the stack substrate in the bonding process. In such a case, the horizontal deviation of the first and the second substrates W1 and W2 may be minimized when the target height H and the maximal deflection ΔZ may correspond to the chuck scale difference between the first and the second chuck scales ST and SB. For example, an appropriate proportional constant C1 may be selected in such a way that the chuck scale difference may be sufficiently converted into the horizontal displacement of the first and the second substrates W1 and W2 in view of the linearity of the first and the second substrates W1 and W2.

When the concave and the convex surface profiles C1 and C2 are interfered with each other, the first substrate W1 may be partially contact with the second substrate W2. For example, the central portions of the first and second substrates W1 and W2 may be overlapped and the peripheral portions of the first and second substrates W1 and W2 may be spaced apart, so that the horizontal deformation of the first and the second substrates W1 and W2 may be non-uniform along the central portions and the peripheral portions, which may increase the non-linearity for the conversion from the curved surface to the flat surface in the bonding process. In addition, when the first and the second substrates W1 and W2 are spaced apart so far from each other in the chamber 100, the push rod 240 may drive the first substrate W1 to move downwards along a relatively long distance and a relatively higher push pressure may be applied to the first substrate W1. In such a case, a tensional stress may increase at the peripheral portion of the first substrate W1 due to the high push pressure, which may also increase the non-linearity for the conversion from the curved surface to the flat surface in the bonding process.

For those reasons, the bonding gap G may be determined as such a minimal distance between the upper and the lower chucks 200 and 300 that the non-linearity for the conversion from the curved surface to the flat surface may be minimized in the bonding process. For example, the first and the second substrates W1 and W2 may be spaced apart from each other by the minimal gap distance by which the linearity for converting the target height H and the maximal deflection ΔZ into the chuck scale difference in boding the first and the second substrates W1 and W2. In an implementation, the bonding gap G may be determined by the following Equation (4).

$$G = H + C2\Delta Z \tag{4}$$

(wherein, G denotes the bonding gap between the upper and the lower chucks, H denotes the target height, ΔZ denotes the maximal deflection and C2 denotes a proportional constant). In an implementation, the proportional constant may be in a range of about 0.9 to about 1.5.

For example, a chuck driving signal generator 542 may be provided in the bonding gapper 540. When the bonding gap G is determined by the bonding gapper 540, the chuck driving signal generator 542 may generate a chuck driving signal for adjusting the gap distance between the lower stage 310 and the upper stage 210 to the bonding gap G. Then, the central processor 550 of the chuck controller 500 may transfer the chuck driving signal to the second power source P2 and the support base 350. Thus, the support base 350 may be moved upwards or downwards in response to the chuck driving signal.

Accordingly, the upper chuck 200 holding the first substrate W1 and the lower chuck 300 holding the second substrate W2 may be spaced apart by the bonding gap G in the chamber 100.

According to the present example embodiment of the substrate bonding apparatus, the upper chuck to which the first substrate may be secured with the concave surface profile and the lower chuck (to which the second substrate may be secured with the convex surface profile by a plurality of height-variable protrusions) may be provided with the substrate bonding apparatus. For example, the substrate detector may be provided with the upper and lower chucks so as to detect the horizontal deformations of the first and the second substrates and the maximal deflection of the concave surface profile. The difference between the horizontal deformations of the first and the second substrates may be detected as the chuck scale difference. The chuck controller may also be provided with the substrate bonding apparatus for determining the target height of the convex surface profile and the bonding gap between the upper and the lower chucks. In an implementation, the target height of the convex surface profile may be determined as the chuck scale difference and the bonding gap may be determined as the summation of the target height and the maximal deflection. For example, the bonding process between the curved surface and the flat surface may be replaced with the bonding process between the curved surface and the curved surface that may be configured on a basis of the chuck scale difference.

Accordingly, the horizontal displacement caused by the conversion from the curved surface to the flat surface in the other bonding process may be included in the shape parameter of the convex surface profile such as the target height, so the horizontal deviation of the stack substrate may be sufficiently reduced in the substrate bonding apparatus.

According to the some substrate bonding apparatuses for bonding the curved substrate and the flat substrate, the horizontal deviation of the stack substrate may be in a range of about 7 ppm to about 10 ppm. In contrast, according to the present example embodiment of the substrate bonding apparatus for bonding the curved substrate and the curved substrate, the horizontal deviation of the stack substrate may be below about 1 ppm.

Hereinafter, the method of bonding substrates in the substrate bonding apparatus 1000 will be described in detail with reference to FIGS. 7 to 10.

FIGS. 7 to 10 illustrate views of stages in a method of bonding substrates in the substrate bonding apparatus shown in FIG. 1.

Figure 7:
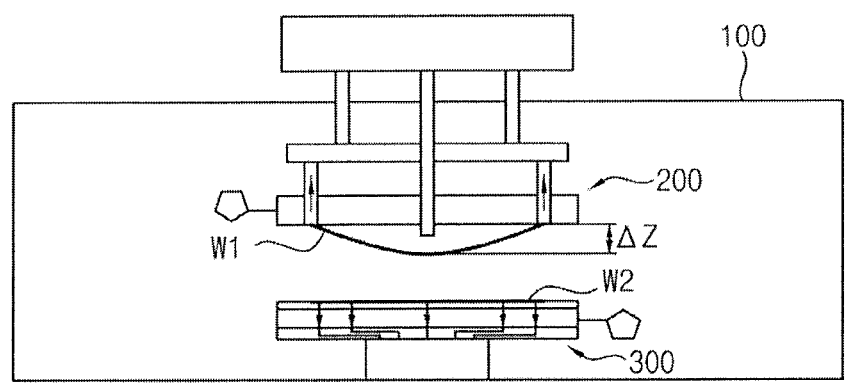
FIGS. 7 to 10 illustrate views of stages in a method of bonding substrates in the substrate bonding apparatus shown in FIG. 1.

Referring to FIGS. 1 and 7, the first substrate W1 secured to the upper chuck 200 and the second substrate W2 secured to the lower chuck 300 may be aligned with each other, so the first and the second substrates W1 and W2 may have the same center position in the chamber 100. In such a case, the first substrate W1 may be secured to the upper chuck 200 with the concave surface profile C1 and the second substrate W2 may be secured to the lower chuck 300 with the flat surface profile.

The center positions and the edge positions of the first and second substrates W1 and W2 may be detected by the first and second cameras 411 and 412 of the position detector 410. Further, the maximal deflection ΔZ of the concave surface profile C1 of the first substrate W1 may be detected by the deflection detector 420 such as the gap sensor.

The lower chuck 200 may move and rotate by the support base 350 in such a way that the center position of the first substrate W1 may coincide with the center position of the second substrate W2. The first detected distance may be obtained as the distance between the center and the edge of the first substrate W1 and the second detected distance may be obtained as the distance between the center and the edge of the second substrate W2. The difference between the first detected distance and the first bulk distance, a gap distance between the center and the edge of the first bulk substrate, may be detected as the first chuck scale ST. In the same way, the difference between the second detected distance and the second bulk distance, a gap distance between the center and the edge of the second bulk substrate, may be detected as the second chuck scale SB. The chuck scale difference may be obtained as the difference between the first chuck scale ST and the second chuck scale SB.

Figure 8:
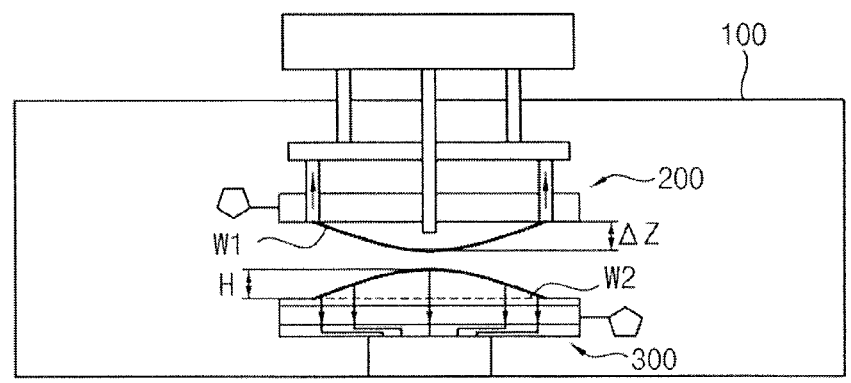

Referring to FIGS. 1 and 8, the target height H may be obtained from the chuck scale difference and the shape of the second substrate W2 may be transformed to the convex surface profile C2 from the flat surface profile by using the target height as the shape parameter of the convex surface profile C2.

When the target height H is obtained in the parameter generator 530, the driving signal generator 532 may generate a driving signal for protruding the protrusions 320 from the lower stage 310. Then, the central processor 550 of the chuck controller 500 may transfer the driving signal to the second power source P2 and the power controller 344 of the level controller 340. Thus, the protrusions 320 may be protruded from the lower stage 310 by the concentric circles in response to the driving signal.

Therefore, the protrusions 320 on the central portion of the lower stage 310 may be protruded to the protruding height PH corresponding to the target height H and the other protrusions 320 except the central protrusions may be protruded to the protruding heights PH that may be smaller than the protruding height PH of the central protrusions and may decrease step by step toward the peripheral portion of the lower stage 310. Accordingly, the top surface levels SL of the protrusions 320 may decrease in the radial direction of the disk-shaped lower stage 310. The second substrate W2 may be deformed into the upward parabolic curve having a vertex corresponding to the target height H along a whole surface of the lower stage 310, so that the second substrate W2 may be deformed into the convex surface profile C2. Accordingly, the concave surface profile C1 of the first substrate W1 may be shaped into a downward parabolic curve having a vertex corresponding to the maximal deflection ΔZ and the convex surface profile C2 of the second substrate W2 may be shaped into an upward parabolic curve having a vertex corresponding to the target height H.

In an implementation, the substrate bonding apparatus 1000 may include the lower chuck 300 shown in FIGS. 3A to 3C and the protruding heights PH of the protrusions 320 may be changed just by individually protruding each protrusion 320. In an implementation, the substrate bonding apparatus 1000 may include the lower chucks 301 and 302 shown in FIGS. 4A to 5C and the protruding heights of the protrusions 320 may be changed just by expanding the elastic base 360 or 369, so that a group of the protrusions 320 on the same portion of the elastic base 360 or 369 may have the same top surface level SL.

Figure 9:
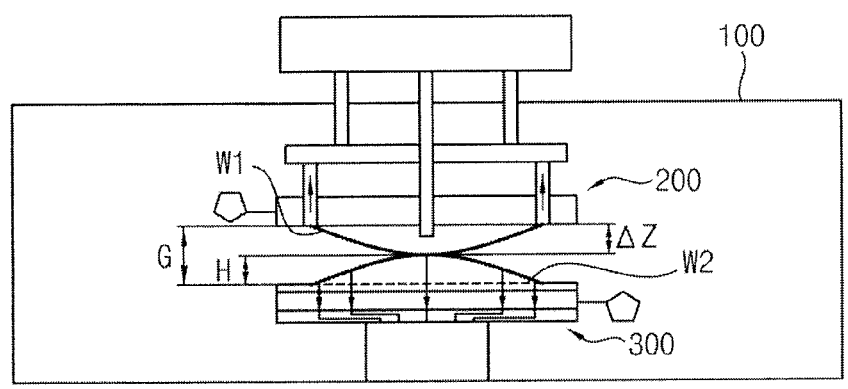

Referring to FIGS. 1 and 9, the lower chuck 300 may be controlled by the support base 350 in such a configuration that the lower stage 310 may be spaced apart from the upper stage 210 by the bonding gap G that may be determined by the target height H and the maximal deflection ΔZ. The bonding gap G may be a minimal gap distance between the upper and the lower chucks 200 and 300 for converting the vertical deformation such as the maximal deflection ΔZ and the target height H to the horizontal deformation such as the chuck scale difference in consideration of the linearity of the first and the second substrates W1 and W2. For example, the bonding gap G may be determined by the above Equation (4).

When the bonding gap G is determined by the bonding gapper 540, the chuck driving signal generator 542 may generate a chuck driving signal for adjusting the gap distance between the lower stage 310 and the upper stage 210 to the bonding gap G. Then, the central processor 550 of the chuck controller 500 may transfer the chuck driving signal to the second power source P2 and the support base 350. Accordingly, the upper chuck 200 holding the first substrate W1 and the lower chuck 300 holding the second substrate W2 may be spaced apart by the bonding gap G in the chamber 100.

Figure 10:
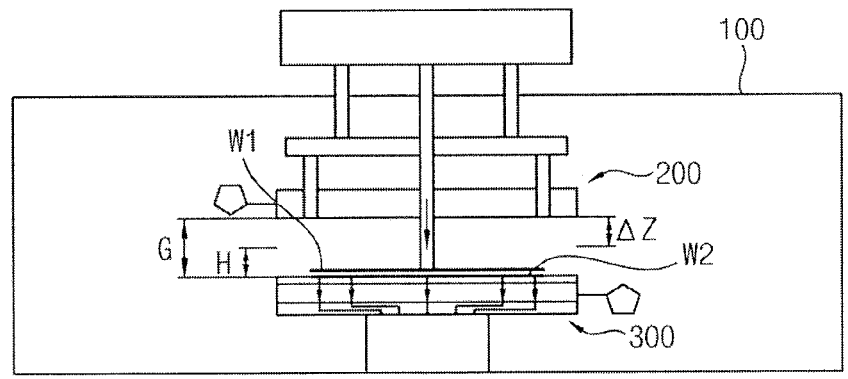

Referring to FIGS. 1 and 10, the first substrate W1 having the concave surface profile C1 may be pushed to the second substrate W2 having the convex surface profile C2, until the first and the second substrates W1 and W2 are bonded to each other, to thereby form the stack substrate in which the first substrate W1 is stacked on the second substrate W2 with minimizing horizontal deviation therebetween.

For example, the push rod 240 may move downwards through the upper stage 210 and may press the first substrate W1 toward the second substrate W2 by the push pressure. Accordingly, the first and the second substrates W1 and W2 may be bonded to each other, thereby forming the stack substrate.

According to the example embodiments, the upper chuck to which the first substrate may be secured with the concave surface profile and the lower chuck to which the second substrate may be secured with the convex surface profile by a plurality of height-variable protrusions may be provided with the substrate bonding apparatus. For example, the substrate detector may be provided with the upper and lower chucks so as to detect the horizontal deformations of the first and the second substrates and the maximal deflection of the concave surface profile. The difference between the horizontal deformations of the first and the second substrates may be detected as the chuck scale difference. The chuck controller may also be provided with the substrate bonding apparatus for determining the target height of the convex surface profile and the bonding gap between the upper and the lower chucks. In an implementation, the target height of the convex surface profile may be determined as the chuck scale difference and the bonding gap may be determined as the summation of the target height and the maximal deflection. Thus, the other bonding process between the curved surface and the flat surface may be replaced with the bonding process between the curved surface and the curved surface that may be configured on a basis of the chuck scale difference.

By way of summation and review, in some stack packaging processes, a pair of upper and lower substrates may be loaded into a substrate bonding apparatus in such way that the upper substrate is secured to an upper chuck and the lower substrate is secured to a lower chuck. Then, the upper chuck moves downwardly to the lower chuck until the upper substrate makes contact with the lower substrate, and the upper and lower substrates are formed into a stack substrate.

The lower substrate may be mounted on an upper surface of the lower chuck and a suction pressure may be uniformly applied to a lower surface of the lower chuck. Thus, the lower substrate may make uniform contact with the upper surface of the lower chuck and may be uniformly secured to the upper surface of the lower chuck like a flat plate. In contrast, the upper substrate may hang onto a lower surface of the upper chuck and a suction pressure may be applied to a peripheral portion of an upper surface of the upper chuck. Thus, a peripheral portion of the upper substrate may make contact with the lower surface of the upper chuck by the suction pressure and the upper substrate may be secured to the upper chuck at the peripheral portion thereof. However, a central portion of the upper substrate may not make contact with the upper chuck, and may be spaced apart a little bit from the upper chuck when no suction pressure is applied to the central portion of the upper chuck. The upper substrate may be deflected downwardly from the peripheral portion to a central portion thereof due to the weight of the upper substrate, and the upper substrate may be secured to the upper chuck like a curved plate due to the downward deflection.

In spite of the above shape difference between the upper and the lower substrates in the bonding apparatus, the upper chuck may move downwardly and may make contact with the lower chuck just after the center alignment between the upper and the lower chucks. Therefore, the upper substrate could be deformed horizontally due to the downward deflection when the upper substrate is bonded to the lower substrate.

In such a case, the upper and the lower substrates may not be accurately aligned with each other due to the horizontal deformation of the upper surface although the center of the upper substrate is accurately aligned with the center of the lower substrate.

The horizontal deformation of the upper substrate may increase from the center to the edge thereof, and the misalignment between the contact pad of the upper substrate (upper pad) and the contact pad of the lower substrate (lower pad) could increase from a central portion to an edge portion of the stack substrate. Thus, the misalignment between the upper pad and the lower pad, which is widely referred to as a horizontal deviation, could be maximized in the peripheral portion of the stack substrate.

As the chip density and the performance of stack packages increases, the number of the contact pads on the substrate may remarkably increase. Thus, the horizontal deviation of the contact pads caused by the horizontal deformation of the upper substrate could have a greater effect on the bonding reliability of the stack substrate.

The embodiments may provide a substrate boding apparatus in which upper and lower substrates are bonded to each other under a curved surface profile to thereby minimize the horizontal deviation of the contact pads in the stack substrate.

The embodiments may provide a method of bonding substrates with high reliability using the substrate bonding apparatus.

According to an embodiment, horizontal displacement caused by the conversion from the curved surface to the flat surface in other bonding processes may be included in the shape parameter of the convex surface profile such as the target height, so the horizontal deviation of the stack substrate may be sufficiently reduced in the substrate bonding apparatus.

The embodiments may provide a substrate bonding apparatus for bonding a pair of wafers having a plurality of semiconductor chips.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate bonding apparatus, comprising:
an upper chuck securing a first substrate onto a lower surface thereof such that the first substrate is downwardly deformed into a concave surface profile;
a lower chuck arranged under the upper chuck and securing a second substrate onto an upper surface thereof such that the second substrate is upwardly deformed into a convex surface profile; and
a chuck controller controlling the upper chuck and the lower chuck to secure the first substrate and the second substrate, respectively, and generating a shape parameter for changing a shape of the second substrate to the convex surface profile from a flat surface profile,
wherein the lower chuck includes a lower stage having a flat plate shape, a plurality of protrusions arranged on an upper surface of the lower stage and supporting the second substrate, a suction controller applying a suction pressure to the second substrate via the plurality of protrusions to thereby secure the second substrate to the plurality of protrusions and a level controller controlling top surface levels of the plurality of protrusions.

2. The substrate bonding apparatus as claimed in claim 1, wherein the lower stage has a disk plate shape and the plurality of protrusions is arranged on the lower stage in a shape of a plurality of concentric circles with respect to a center of the lower stage such that the top surface levels of the plurality of protrusions are varied in conformity with the convex surface profile of the second substrate.

3. The substrate bonding apparatus as claimed in claim 2, wherein the suction controller includes:
   a plurality of suction lines through which the suction pressure is applied to the second substrate; and
   a pressure controller that is commonly connected to the plurality of suction lines and that controls the suction pressure of each of the suction lines such that protrusions of a same concentric circle are under a same suction pressure.

4. The substrate bonding apparatus as claimed in claim 2, wherein the level controller includes:
   a plurality of driving lines through which a driving power is transferred to the plurality of protrusions such that each protrusion is protruded to a protruding height from the lower stage; and
   a power controller that is commonly connected to the plurality of driving lines and that controls the driving power of each of the driving lines such that protrusions of a same concentric circle have a same protruding height and the protruding heights of the plurality of protrusions decrease in a radial direction of the lower stage, thereby decreasing the top surface levels in the radial direction of the lower stage.

5. The substrate bonding apparatus as claimed in claim 1, wherein the lower chuck further includes a disk-shaped elastic base interposed between the lower stage and the plurality of protrusions and expanded such that a height of the disk-shaped elastic base decreases in a radial direction and the top surface levels of the plurality of protrusions decrease in conformity with the concave surface profile of the second substrate.

6. The substrate bonding apparatus as claimed in claim 5, wherein the disk-shaped elastic base includes a center disk and a plurality of separated rings enclosing the center disk and arranged concentrically in a radial direction such that the center disk and the separated rings are individually expandable.

7. The substrate bonding apparatus as claimed in claim 6, wherein a width of each separated ring decreases in the radial direction such that the width of an innermost separated ring proximate to the center disk is larger than that of an outermost separated ring distal to the center disk.

8. The substrate bonding apparatus as claimed in claim 6, wherein the level controller includes:
   a plurality of expanding lines through which an expanding power is transferred to each of the center disk and the plurality of separated rings such that the center disk and the plurality of separated rings are individually expanded to a height from the lower stage; and
   a power controller that is commonly connected to the plurality of expanding lines and that controls the expanding power of each of the expanding lines such that the heights of the center disk and the plurality of separated rings decrease in the radial direction, thereby decreasing the top surface levels of the plurality of protrusions.

9. The substrate bonding apparatus as claimed in claim 8, wherein at least one of the center disk and the plurality of separated rings includes a plurality of an angular separation pieces separated in an angular direction at a same central angle.

10. The substrate bonding apparatus as claimed in claim 9, wherein the level controller includes a plurality of branch lines diverged from at least one of the expanding lines, the plurality of branch lines being individually connected to the angular separation pieces, respectively, such that the expanding power is individually applied to each of the angular separation pieces.

11. The substrate bonding apparatus as claimed in claim 1, further comprising a substrate detector having a position detector detecting positions of the first substrate and the second substrate and a deflection detector detecting a maximal deflection of the concave surface profile of the first substrate.

12. The substrate bonding apparatus as claimed in claim 11, wherein the position detector includes a pair of optical cameras that is arranged at sides of the upper chuck and the lower chuck, respectively, and the deflection detector includes a gap sensor.

13. The substrate bonding apparatus as claimed in claim 11, wherein the chuck controller includes:
   an aligner aligning the first substrate and the second substrate with each other such that a center position of the first substrate coincides with a center position of the second substrate;
   a scaler generating a first chuck scale from a horizontal deformation of the first substrate and a second chuck scale from a horizontal deformation of the second substrate;
   a parameter generator generating the shape parameter from the first chuck scale and the second chuck scale; and
   a bonding gapper generating a bonding gap between the upper chuck and the lower chuck as a minimal gap distance for a linearity in converting the concave surface profile and the convex surface profile to a flat surface profile when the first substrate and the second substrate are bonded to each other.

14. The substrate bonding apparatus as claimed in claim 13, wherein:
   the shape parameter includes a maximal height of the convex surface profile obtained by a following Equation (1)

$$H=C1(ST-SB) \qquad (1), \text{ and}$$

in Equation (1), H denotes the maximal height of the convex surface profile, ST denotes the first chuck scale, SB denotes the second chuck scale, and C1 denotes a proportional constant.

15. The substrate bonding apparatus as claimed in claim 14, wherein:
   the bonding gap is obtained by a following Equation (2)

$$G=H+C2\Delta Z \qquad (2),$$

in Equation (2), G denotes the bonding gap, H denotes the maximal height of the convex surface profile, $\Delta Z$ denotes the maximal deflection of the concave surface profile and C2 denotes a proportional constant.

16. The substrate bonding apparatus as claimed in claim 1, wherein the upper chuck includes an upper stage shaped into a flat plate of which a diameter is greater than that of the first substrate and a plurality of suction lines penetrating a peripheral portion of the upper stage and applying a first suction pressure to a peripheral portion of the first substrate.

17. A substrate bonding apparatus, comprising:
   an upper chuck on which a first substrate is securable such that the first substrate has a downwardly parabolic surface profile;
   a lower chuck arranged under the upper chuck, a second substrate being securable on the lower chuck and the lower chuck being configured to change a shape of the second substrate from a flat profile to an upwardly parabolic profile; and a chuck controller that controls the upper chuck and the lower chuck, the chuck controller being configured to:

generate a shape parameter for changing the shape of the second substrate to the upwardly parabolic profile from the flat profile, and move the upper chuck or the lower chuck to bring the first substrate into contact with the second substrate and bond the first substrate with the second substrate, wherein the lower chuck includes:

a lower stage having a flat plate shape, a plurality of protrusions arranged on an upper surface of the lower stage and supporting the second substrate, a suction controller configured to apply a suction pressure to the second substrate via the plurality of protrusions to thereby secure the second substrate to the plurality of protrusions, and a level controller configured to control top surface levels of the plurality of protrusions.

18. The substrate bonding apparatus as claimed in claim 17, wherein the plurality of protrusions are individually adjusted by the level controller to press against the second substrate and change the shape of the second substrate.

* * * * *